United States Patent
Utsumi et al.

(10) Patent No.: US 10,886,398 B2
(45) Date of Patent: Jan. 5, 2021

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventors: Makoto Utsumi, Matsumoto (JP); Yoshiyuki Sakai, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/384,413

(22) Filed: Apr. 15, 2019

(65) Prior Publication Data
US 2019/0378921 A1    Dec. 12, 2019

(30) Foreign Application Priority Data
Jun. 12, 2018   (JP) .................... 2018-112018

(51) Int. Cl.
| | |
|---|---|
| *H01L 29/78* | (2006.01) |
| *H01L 29/16* | (2006.01) |
| *H01L 21/3105* | (2006.01) |
| *H01L 29/51* | (2006.01) |
| *H01L 29/66* | (2006.01) |

(52) U.S. Cl.
CPC .... *H01L 29/7813* (2013.01); *H01L 21/31053* (2013.01); *H01L 29/1608* (2013.01); *H01L 29/511* (2013.01); *H01L 29/66068* (2013.01)

(58) Field of Classification Search
CPC ............. H01L 29/7813; H01L 29/1608; H01L 21/31053; H01L 29/511; H01L 29/66068; H01L 29/0878; H01L 29/1095; H01L 29/0623; H01L 29/7802
See application file for complete search history.

(56) References Cited

U.S. PATENT DOCUMENTS

| | | | |
|---|---|---|---|
| 5,286,681 A | * | 2/1994 | Maeda .............. H01L 21/76819 438/760 |
| 6,261,975 B1 | | 7/2001 | Xia et al. |

(Continued)

FOREIGN PATENT DOCUMENTS

| | | |
|---|---|---|
| JP | 1-109727 A | 4/1989 |
| JP | 2538722 B2 | 10/1996 |

(Continued)

OTHER PUBLICATIONS

Dyer ("Moisture Instability of Borophosphosilicate Glass and the Effects of Thermal Treatment," J. Electrochem. Soc., vol. 145, No. 11, 3950-3956, Nov. 1998) (Year: 1998).*

*Primary Examiner* — Yasser A Abdelaziez

(57) ABSTRACT

A MOS-gate silicon carbide semiconductor device has an interlayer insulating film that covers a gate electrode and that has a 2-layer structure in which a NSG film and a BPSG film are sequentially stacked. The BPSG film has a boron concentration in a range from 4.5 mol % to 8.0 mol %. The BPSG film has a phosphorus concentration in a range from 1.0 mol % to 3.5 mol %. The NSG film has a thickness in a range from 50 nm to 400 nm. The BPSG film has a thickness in a range from 400 nm to 800 nm. A distance from the gate insulating film to the BPSG film is at most 100 nm at a portion where the gate insulating film and the BPSG film oppose each other across the NSG film.

18 Claims, 10 Drawing Sheets

(56) References Cited

U.S. PATENT DOCUMENTS

| | | | | |
|---|---|---|---|---|
| 7,851,881 B1 * | 12/2010 | Zhao | ................... | H01L 21/0495 |
| | | | | 257/471 |
| 2005/0006693 A1 * | 1/2005 | Ngo | ................. | H01L 21/31625 |
| | | | | 257/315 |
| 2012/0193643 A1 * | 8/2012 | Masuda | .............. | H01L 29/1095 |
| | | | | 257/77 |

FOREIGN PATENT DOCUMENTS

| | | |
|---|---|---|
| JP | 2002-76342 A | 3/2002 |
| JP | 2006-128526 A | 5/2006 |
| JP | 4489898 B2 | 6/2010 |
| JP | 6086360 B2 | 3/2017 |
| JP | 6245723 B2 | 12/2017 |

* cited by examiner

FIG.7

| B CONCEN-TRATION (mol%) | P CONCEN-TRATION (mol%) | TOTAL AMOUNT OF RELEASED H AND $H_2O$ (ATOMS/$cm^3$) | SUPPRESSION OF GATE THRESHOLD VOLTAGE VARIATION | THB TEST 950°C FIRING | 1050°C FIRING | 950°C FIRING, Al ADDITION: 0.1 TIMES | 950°C FIRING, Al ADDITION: 1 TIMES |
|---|---|---|---|---|---|---|---|
| 0.0 | 1.3 | $9.9 \times 10^{19}$ | × | ○ | ○ | — | — |
| 4.0 | 1.2 | $3.3 \times 10^{21}$ | × | ○ | ○ | — | — |
| 5.6 | 1.2 | $4.5 \times 10^{21}$ | ○ | ○ | ○ | ○ | ○ |
| 7.2 | 1.2 | $5.9 \times 10^{21}$ | ○ | × | ○ | ○ | ○ |
| 5.5 | 2.3 | $4.4 \times 10^{21}$ | ○ | ○ | ○ | ○ | ○ |
| 5.4 | 3.0 | $4.2 \times 10^{21}$ | ○ | × | ○ | ○ | ○ |

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2018-112018, filed on Jun. 12, 2018, the entire contents of which are incorporated herein by reference.

BACKGROUND

1. Field

Embodiments of the invention relate to a silicon carbide semiconductor device and a method of manufacturing a silicon carbide semiconductor device.

2. Description of Related Art

Formation of a borophosphosilicate glass (BPSG) film as an interlayer insulating film that covers an element structure is conventionally known. When unevenness occurs on a main surface of a semiconductor substrate (semiconductor chip), for example, due to an element structure such as a MOS gate (insulated gate constituted by a metal, an oxide film, and a semiconductor) structure, unevenness corresponding to unevenness of an underlying layer of the interlayer insulating film occurs at a surface of the interlayer insulating film that covers the element structure.

As a method of solving this problem, a method is proposed in which reflow properties (fluidity) of the interlayer insulating film are improved and recesses having a high aspect ratio (=depth/width) and occurring at the main surface of the semiconductor substrate due to unevenness caused by the element structure are embedded with the interlayer insulating film, thereby making the interlayer insulating film flat (e.g., refer to Japanese Patent No. 4489898, Japanese Laid-Open Patent Publication No. 2002-076342, Japanese Patent No. 6086360, Japanese Patent No. 6245723, Japanese Laid-Open Patent Publication No. H1-109727, Japanese Patent No. 2538722, and Japanese Laid-Open Patent Publication No. 2006-128526). In Japanese Patent No. 4489898, Japanese Laid-Open Patent Publication No. 2002-076342, Japanese Patent No. 6086360, Japanese Patent No. 6245723, Japanese Laid-Open Patent Publication No. H1-109727, Japanese Patent No. 2538722, and Japanese Laid-Open Patent Publication No. 2006-128526, a boron concentration, a phosphorus concentration, etc. of the interlayer insulating film is adjusted, thereby improving the reflow properties of the interlayer insulating film.

For example, in the method of forming an interlayer insulating film disclosed in Japanese Patent No. 4489898, states of the interlayer insulating film before a reflow process and after the reflow process are respectively depicted in FIGS. 9 and 10. FIGS. 9 and 10 are cross-sectional views of a structure of a conventional semiconductor device during manufacture. FIGS. 9 and 10 are respectively A and B in FIG. 1 of Japanese Patent No. 4489898. On a front surface of a semiconductor substrate 101, multiple protrusions 102a are formed by a MOS gate structure, a conductive layer, etc. of an integrated circuit 110.

On the protrusions 102a of the integrated circuit 110, a fluorinated BPSG (FBPSG) film is deposited as an interlayer insulating film 103 by a chemical vapor deposition (CVD) method. At this time, the interlayer insulating film 103 is embedded in recesses 105 having a low aspect ratio and a wide width and in recesses 104 having a high aspect ratio and narrow widths, the recesses 104 and 105 being formed between the protrusions 102a that are adjacent to each other.

In Japanese Patent No. 4489898, fluorine is added to the interlayer insulating film 103 to improve the reflow properties of the interlayer insulating film 103. As deposition conditions for the interlayer insulating film 103, pressure in a furnace of CVD equipment is set to be a pressure that exceeds 10 Torr, temperature in the furnace is set to be within a range from 400 degrees C. to 600 degrees C., and a gas containing triethoxyfluorosilane (TEFS) is used as a fluorine source supplied to the furnace.

As one example of a composition of the FBPSG film that is the interlayer insulating film 103, a boron (B) concentration of 3 wt % ($B_2O_3$ at 9.5 mol %), a phosphorus (P) concentration of 8 wt % ($P_2O_5$ at 8.8 mol %), and a fluorine (F) concentration of 0.7 wt % is disclosed. Further, reduction of the reflow process temperature for the interlayer insulating film 103 by using a FBPSG film that is a BPSG film to which fluorine is added as the interlayer insulating film 103 is disclosed.

As depicted in FIG. 9, before the reflow process for the interlayer insulating film 103, unevenness at the surface of the interlayer insulating film 103 occurs and corresponds to unevenness caused by the protrusions 102a of the underlying layer of the interlayer insulating film 103. Thereafter, as depicted in FIG. 10, the interlayer insulating film 103 is subject to reflow by the reflow process of a temperature that exceeds a glass transition temperature, whereby the interlayer insulating film 103 on the protrusions 102a of the integrated circuit 110 transitions to a fluid and moves between the protrusions 102a that are adjacent, whereby the interlayer insulating film 103 becomes flat.

SUMMARY

According to an embodiment of the present invention, a silicon carbide semiconductor device includes an element structure provided on a front surface side of a semiconductor substrate and having a predetermined semiconductor region provided in the semiconductor substrate and a protrusion protruding from a front surface of the semiconductor substrate; an interlayer insulating film having a 2-layer structure including a first insulating film that covers the element structure and a second insulating film that covers the first insulating film; a contact hole penetrating the interlayer insulating film in a depth direction and reaching the semiconductor substrate; and an electrode provided on a surface of the interlayer insulating film and electrically connected to the semiconductor region via the contact hole. The first insulating film is a non-doped silicon oxide film. The second insulating film is an oxide film containing boron and phosphorus. The second insulating film has a boron concentration in a range from 4.5 mol % to 8.0 mol %.

In the embodiment, the second insulating film has a phosphorus concentration in a range from 1.0 mol % to 3.5 mol %.

In the embodiment, the first insulating film has a thickness in a range from 50 nm to 400 nm.

In the embodiment, the second insulating film has a thickness in a range from 400 nm to 800 nm.

In the embodiment, the element structure is an insulated gate structure constituted by a metal, an oxide film, and a semiconductor, the insulated gate structure having a gate electrode provided on the front surface of the semiconductor substrate via a gate insulating film. The protrusion is the gate insulating film and the gate electrode. The first insulating film covers the gate electrode. A distance from the gate insulating film to the second insulating film is at most 100 nm at a portion where the gate insulating film and the second insulating film oppose each other across the first insulating film.

According to another embodiment of the present invention, a method of manufacturing a silicon carbide semiconductor device having on a front surface side of a semiconductor substrate, an element structure that has a predetermined semiconductor region provided in the semiconductor substrate and a protrusion protruding from a front surface of the semiconductor substrate, includes forming in the semiconductor substrate, the predetermined semiconductor region constituting the element structure; forming on a front surface of the semiconductor substrate, the protrusion constituting the element structure; stacking sequentially on the front surface of the semiconductor substrate, a first insulating film covering the element structure and a second insulating film covering the first insulating film, and forming an interlayer insulating film having a 2-layer structure constituted by the first insulating film and the second insulating film; performing heat treatment and planarizing a surface of the interlayer insulating film; partially removing the interlayer insulating film after planarizing the surface of the interlayer insulating film, and forming a contact hole that penetrates the interlayer insulating film in a depth direction and reaches the semiconductor substrate; and forming an electrode on the surface of the interlayer insulating film, embedding the electrode in the contact hole, and electrically connecting the semiconductor region and the electrode. Forming the interlayer insulating film includes forming a non-doped silicon oxide film as the first insulating film, and forming an oxide film containing boron and phosphorus, as the second insulating film. The second insulating film has a boron concentration in a range from 4.5 mol % to 8.0 mol %.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 7 is a table depicting relationships of the boron concentration and the phosphorus concentration of the BPSG film with gate threshold voltage variation;

DESCRIPTION OF EMBODIMENTS

Figure 1:
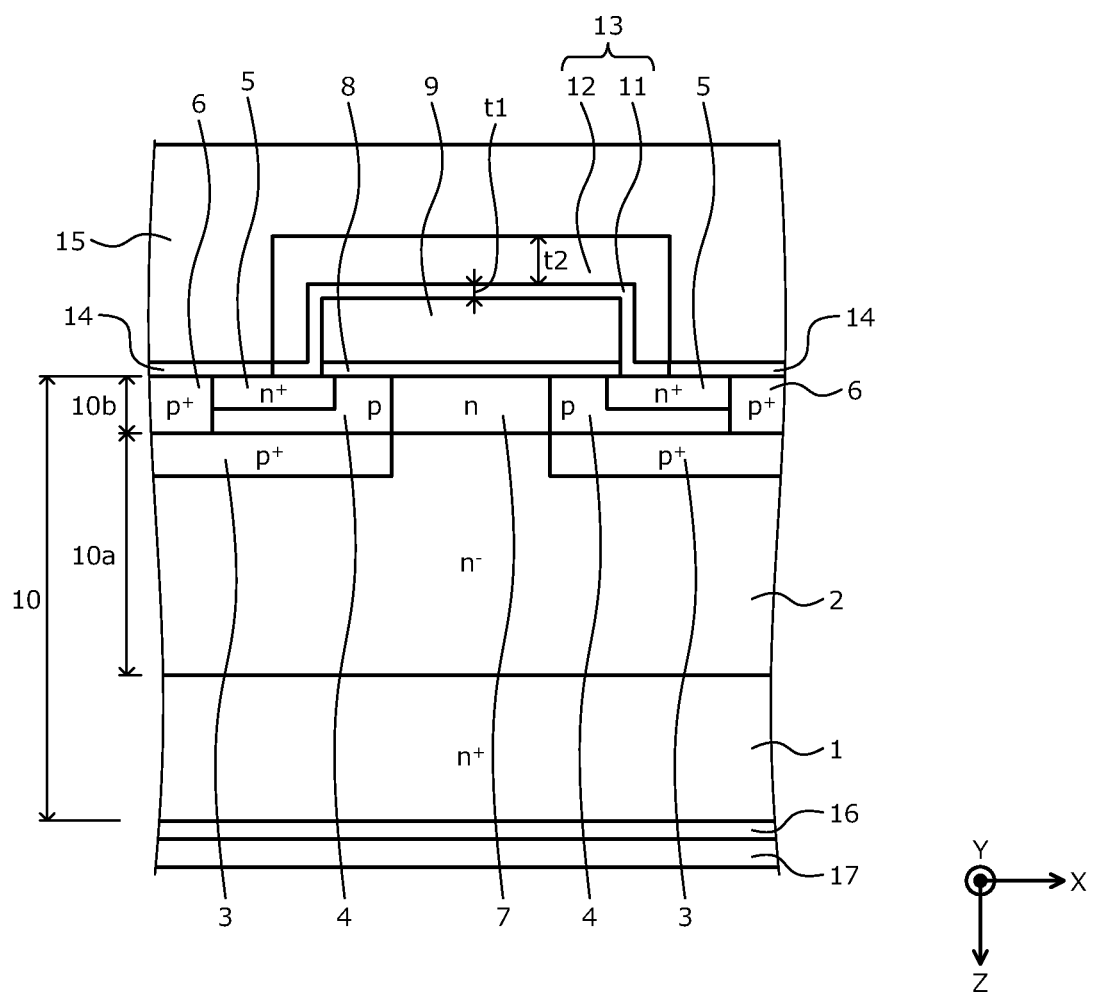
FIG. 1 is a cross-sectional view of a structure of a silicon carbide semiconductor device according to a first embodiment.

First, problems associated with the related techniques will be discussed. The interlayer insulating film 103 easily absorbs moisture and during heat treatment, when water is released from the interlayer insulating film 103, together with the water, boron atoms and phosphorus atoms in the interlayer insulating film 103 easily disassociate and diffuse outside (outward diffusion). Japanese Patent No. 4489898 describes that when the boron concentration of the interlayer insulating film 103 is 6 wt % or higher, the interlayer insulating film 103 is easily affected by moisture and outward diffusion. Further, the water released from the interlayer insulating film 103 and the atoms disassociated with the water tend to adversely affect the semiconductor substrate 101 and the integrated circuit 110.

In Japanese Patent No. 4489898, an effect obtained by adding fluorine to the interlayer insulating film 103 is an ability to set a lower boron concentration and phosphorus concentration of the interlayer insulating film 103, and to lower the reflow process temperature for the interlayer insulating film 103. In adding fluorine to the interlayer insulating film 103, outward diffusion of the boron atoms and the phosphorus atoms from the interlayer insulating film 103 cannot be prevented. For example, the boron atoms and the phosphorus atoms from the interlayer insulating film 103 disassociate as boric acid and phosphoric acid, and erode members (e.g., front electrode, wiring, etc.) near the interlayer insulating film 103.

Further, when the boron concentration and the phosphorus concentration of the interlayer insulating film are low, for example, in a MOS-gate silicon carbide semiconductor device such as a metal oxide semiconductor field effect transistor (MOSFET) that contains silicon carbide (SiC) and has an insulated gate constituted by a 3-layer structure that includes a metal, an oxide film, and a semiconductor, a phenomenon is observed in which gate threshold voltage varies and becomes low in a low current region. Decreases in the gate threshold voltage in a low current region cause leak current and lead to device operation failures.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

A structure of a planar gate silicon carbide semiconductor device according to a first embodiment will be described taking a MOSFET as an example. FIG. 1 is a cross-sectional view of a structure of a silicon carbide semiconductor device according to the first embodiment. In FIG. 1, only an active region is depicted while an edge termination region that surrounds a periphery of the active region is not depicted. The active region is a region in which current flows during an ON state. The edge termination region is a region of an n⁻-type drift region 2, between the active region and a side surface of a semiconductor substrate (semiconductor chip) 10, the region mitigating electric field on a chip front surface side and sustaining breakdown voltage (withstand voltage). The breakdown voltage is a voltage limit at which errant operation and damage of an element does not occur.

The silicon carbide semiconductor device according to the first embodiment and depicted in FIG. 1 is a vertical MOSFET having a planar-gate MOS gate structure on a front surface side of the semiconductor substrate 10 that contains silicon carbide (SiC). The semiconductor substrate 10 is an epitaxial substrate in which semiconductor layers 10a, 10b constituting the type drift region 2 and a p-type base region 4 are sequentially formed by epitaxial growth on a front surface of an n⁺-type starting substrate 1 that constitutes an n⁺-type drain region. Here, the semiconductor substrate 10 has, as a front surface, a surface on a side having the p-type semiconductor layer 10b and has, as a rear surface, a surface on a side having the n⁺-type starting substrate 1 (i.e., a rear surface of the n⁺-type starting substrate 1).

In the n⁻-type semiconductor layer 10a, at an interface thereof with the p-type semiconductor layer 10b, a p⁺-type base region 3 is selectively provided in contact with the p-type semiconductor layer 10b. A portion of the n⁻-type semiconductor layer 10a other than the p⁺-type base region 3 constitutes the type drift region 2. An n⁺-type source region 5, a p⁺-type contact region 6, and an n-type junction FET (JFET) region 7 are selectively provided in the p-type semiconductor layer 10b. A portion of the p-type semiconductor layer 10b other than the n⁺-type source region 5, the p⁺-type contact region 6, and the n-type JFET region 7 constitutes the p-type base region 4.

The n⁺-type source region 5, the p⁺-type contact region 6, and the n-type JFET region 7 are exposed at the front surface of the semiconductor substrate 10. The n⁺-type source region 5 and the p⁺-type contact region 6 oppose the p⁺-type base region 3 in a depth direction Z. The n⁺-type source region 5 is provided at a position closer to the n-type JFET region 7 than is the p⁺-type contact region 6. The p⁺-type contact region 6 may penetrate the p-type semiconductor layer 10b in the depth direction Z from the front surface of the semiconductor substrate 10 and reach the p⁺-type base region 3. The n-type JFET region 7 is provided separated from the n⁺-type source region 5 and the p⁺-type contact region 6.

The n-type JFET region 7 opposes the n⁺-type source region 5, across the p-type base region 4, in a direction (hereinafter, first direction) X that is parallel to the front surface of the semiconductor substrate 10. The n-type JFET region 7 penetrates the p-type semiconductor layer 10b in the depth direction Z and reaches a portion of the n⁻-type drift region 2 sandwiched between the p⁺-type base regions 3. The n-type JFET region 7 functions as a drift region together with the n⁻-type drift region 2. On surfaces of the p-type base region 4, the n⁺-type source region 5, and the n-type JFET region 7, a gate electrode 9 is provided via a gate insulating film 8 so as to extend on the surface of the n-type JFET region 7.

The planar-gate MOS gate structure is constituted by the p⁺-type base region 3, the p-type base region 4, the n⁺-type source region 5, the p⁺-type contact region 6, the n-type JFET region 7, the gate insulating film 8, and the gate electrode 9. The p⁺-type base region 3, the p-type base region 4, the n⁺-type source region 5, the p⁺-type contact region 6, the n-type JFET region 7, the gate insulating film 8, and the gate electrode 9, for example, may be disposed in a striped shape that extends along a direction (hereinafter, second direction) Y that is parallel to the front surface of the semiconductor substrate 10 and orthogonal to the first direction X. The gate electrode 9 is covered by an interlayer insulating film 13.

The interlayer insulating film 13 has a 2-layer structure in which a non-doped silicate glass (NSG), i.e., a non-doped silicon oxide ($SiO_2$) film 11 and a BPSG film 12 are sequentially stacked. The NSG film 11 is in contact with the gate insulating film 8. The NSG film 11 has a function of suppressing movement of outward diffusion boron atoms and phosphorus atoms that are from the BPSG film 12, the outward diffusion boron atoms and phosphorus atoms being suppressed from moving toward the gate electrode 9.

The NSG film 11 is provided to have a thickness t1 that from a surface of the gate electrode 9, is uniform spanning the front surface of the semiconductor substrate 10. The thickness t1 of the NSG film 11, for example, is about 200 nm and in terms of design, for example, is permissible in a range from about 50 nm to 400 nm. In other words, at a portion where the gate insulating film 8 and the BPSG film 12 oppose each other across the NSG film 11, a distance from the gate insulating film 8 to the BPSG film 12 may be 100 nm or less.

When the thickness t1 of the NSG film 11 is less than 50 nm, effects of providing the NSG film 11 are not obtained and therefore, is not desirable. When the thickness t1 of the NSG film 11 exceeds 400 nm, the NSG film 11 does not reflow by a reflow (flow) process, and a protrusion due to the gate electrode 9 on the front surface of the semiconductor substrate 10 causes a source electrode 15 to stand vertically from the front surface of the semiconductor substrate 10 due to the NSG film 11, and therefore, is not desirable.

The BPSG film 12 has a function of absorbing moisture such as water vapor contained in outside air. A thickness t2 of the BPSG film 12, for example, is about 600 nm and in terms of design, for example, is permissible to be in a range from about 400 nm to 800 nm. A suitable boron concentration range for the BPSG film 12, for example, is from about 4.5 mol % to 8.0 mol %. A suitable phosphorus concentration range for the BPSG film 12, for example, is from about 1.0 mol % to 3.5 mol %.

Of the boron concentration and the phosphorus concentration of the BPSG film 12, at least the boron concentration is set within the suitable range described above, whereby hygroscopicity of the BPSG film 12 may be enhanced. As a result, moisture in the BPSG film 12 may be suppressed from being released to the outside. The moisture in the BPSG film 12 is constituted by hydrogen (H) atoms and water ($H_2O$) molecules in the BPSG film 12.

Further, enhancing the hygroscopicity of the BPSG film 12 maintains the moisture content of the BPSG film 12 at a certain amount. As a result, movement of hydrogen atoms between the BPSG film 12 and the outside becomes possible and hydrogen atoms from the BPSG film 12 are supplied to a vicinity of the gate electrode 9. As a result, variation of the gate threshold voltage of a low current region of the MOSFET is suppressed.

A moisture amount of the moisture released from the BPSG film 12, for example, is more than $1 \times 10^{20}$ atoms/cm³ but less than $1 \times 10^{22}$ atoms/cm³. The moisture amount released from the BPSG film 12 is a total sum of a diffusion amount of (outward diffusion) hydrogen atoms diffused from the BPSG film 12 to the outside and a released amount of water molecules released from the BPSG film 12 to the outside.

Further, the boron concentration and the phosphorus concentration of the BPSG film 12 are respectively set to be within the suitable ranges described above, whereby the boron concentration and the phosphorus concentration of the BPSG film 12 are set within typical concentration ranges of at least 4.0 mol % and at least 1.2 mol %, respectively. As a result, the boron atoms and the phosphorus atoms in the BPSG film 12 may be suppressed from being dissolved in the moisture released from the BPSG film 12 and from disassociating from the BPSG film 12 and diffusing outside together with the moisture. Therefore, deterioration of members (e.g., a contact electrode 14, the source electrode 15, metal wiring, etc.) near the BPSG film 12 may be suppressed.

In the interlayer insulating film 13, a contact hole is provided that penetrates the interlayer insulating film 13 in the depth direction Z and reaches the front surface of the semiconductor substrate 10. The contact hole of the interlayer insulating film 13 exposes the $n^+$-type source region 5 and the $p^+$-type contact region 6. In the contact hole of the interlayer insulating film 13, the contact electrode 14 is provided on the front surface of the semiconductor substrate 10 and forms ohmic contacts with the $n^+$-type source region 5 and the $p^+$-type contact region 6.

The source electrode 15 is provided so as to be embedded in the contact hole, spanning the front surface of the semiconductor substrate 10 in the contact hole, from on a surface of the interlayer insulating film 13. The source electrode 15 is electrically connected to the $n^+$-type source region 5 and the $p^+$-type contact region 6 via the contact electrode 14, and is electrically insulated from the gate electrode 9 via the interlayer insulating film 13. For example, metal wiring (not depicted) such as a bonding wire or a copper block is soldered to the source electrode 15.

A contact electrode 16 that forms an ohmic contact with the $n^+$-type drain region (the $n^+$-type starting substrate 1) is provided on the rear surface of the semiconductor substrate 10 overall. A drain electrode 17 is provided on a surface of the contact electrode 16 and via the contact electrode 16, is electrically connected to the $n^+$-type starting substrate 1 that is the $n^+$-type drain region. The drain electrode 17, for example, is mounted to an insulated substrate (not depicted) such as a direct copper bonding (DCB) substrate by a solder joint.

Figure 2:
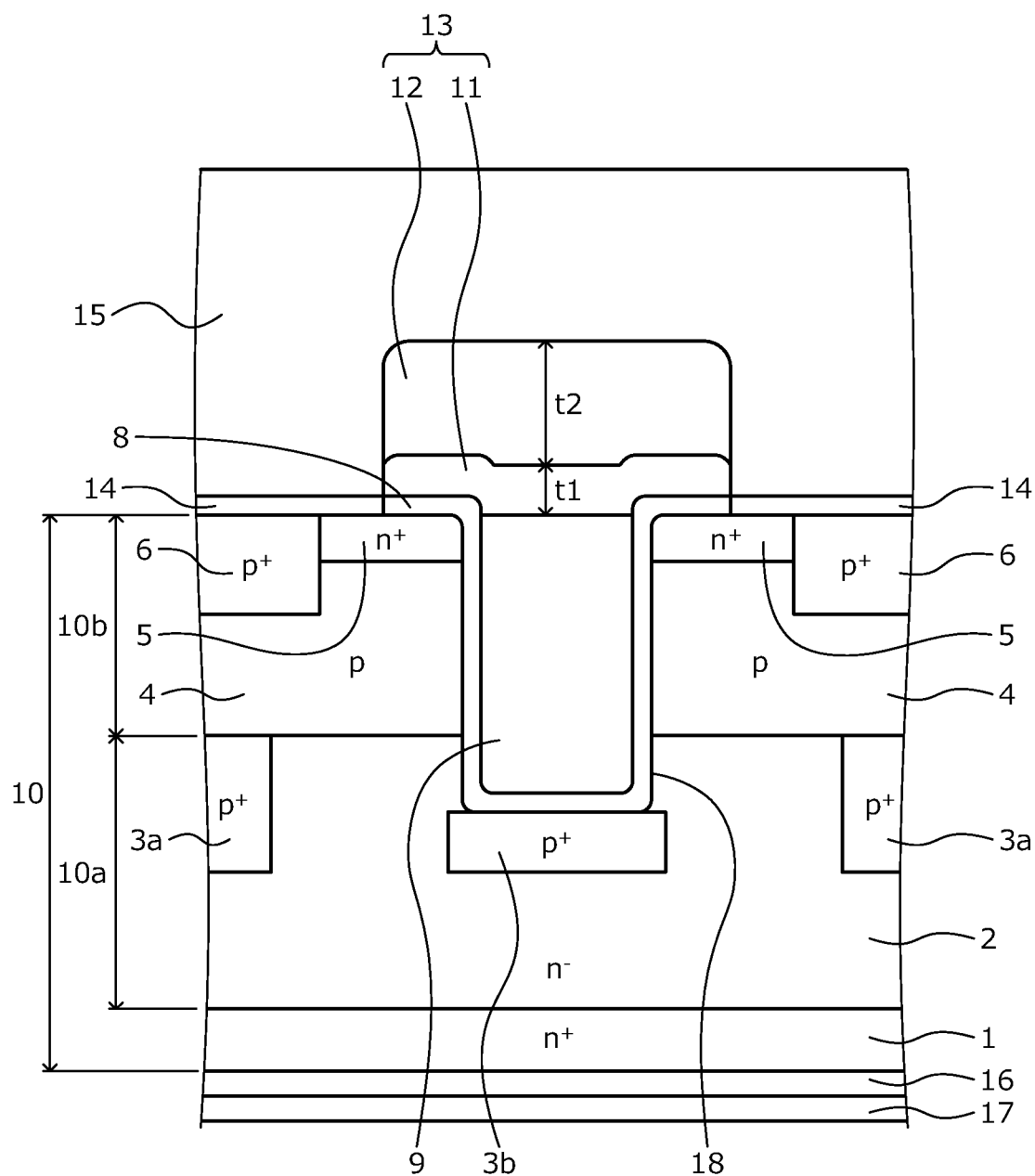
FIG. 2 is a cross-sectional view of a structure of a trench-gate silicon carbide semiconductor device according to a second embodiment.

A structure of a trench-gate silicon carbide semiconductor device according a second embodiment will be described taking a MOSFET as an example. FIG. 2 is a cross-sectional view of the structure of the trench-gate silicon carbide semiconductor device according to the second embodiment. In FIG. 2, only the active region is depicted while the edge termination region that surrounds the periphery of the active region is not depicted.

The silicon carbide semiconductor device according to the second embodiment and depicted in FIG. 2 is a vertical MOSFET having a trench-gate MOS gate structure on the front surface side of the semiconductor substrate 10 that contains silicon carbide (SiC). The semiconductor substrate 10 is the epitaxial substrate in which the semiconductor layers constituting the $n^-$-type drift region 2 and the p-type base region 4 are sequentially formed on the front surface of the $n^+$-type starting substrate 1 that constitutes the $n^+$-type drain region. Here, the semiconductor substrate 10 has, as the front surface, a surface on a side having a p-type semiconductor layer and has, as the rear surface, the surface on the side having the $n^+$-type starting substrate 1 (i.e., the rear surface of the $n^+$-type starting substrate 1).

In the $n^-$-type semiconductor layer 10a, at the interface thereof with the p-type semiconductor layer 10b, a $p^+$-type base region 3a is selectively provided in contact with the p-type semiconductor layer 10b. A portion of the $n^-$-type semiconductor layer 10a other than the $p^+$-type base region 3a constitutes the $n^-$-type drift region 2. In the p-type semiconductor layer 10b, the $n^+$-type source region 5 and the $p^+$-type contact region 6 are each selectively provided. A portion of the p-type semiconductor layer 10b other than the $n^+$-type source region 5 and the $p^+$-type contact region 6 constitutes the p-type base region 4.

The $n^+$-type source region 5 and the $p^+$-type contact region 6 are exposed at the front surface of the semiconductor substrate 10. The $n^+$-type source region 5 and the $p^+$-type contact region 6 oppose the $p^+$-type base region 3a in the depth direction Z. The $p^+$-type contact region 6 may penetrate the p-type semiconductor layer 10b in the depth direction Z from the front surface of the semiconductor substrate 10 and reach the $p^+$-type base region 3a.

A trench 18 is provided that penetrates the p-type base region 4 from the surface of the $n^+$-type source region 5 and reaches the $n^-$-type drift region 2; and the gate electrode 9 is provided on an inner side of the trench 18, via the gate insulating film 8. At a bottom of the trench 18, the $p^+$-type base region 3b is provided.

The trench-gate MOS gate structure is constituted by the $p^+$-type base regions 3a, 3b, the p-type base region 4, the $n^+$-type source region 5, the $p^+$-type contact region 6, the gate insulating film 8, and the gate electrode 9. The $p^+$-type base regions 3a, 3b, the p-type base region 4, the $n^+$-type source region 5, and the $p^+$-type contact region 6, for example, may be disposed in a striped shape that extends in a direction that is along the viewing direction of FIG. 2 and parallel to the front surface of the semiconductor substrate 10. The gate electrode 9 is covered by the interlayer insulating film 13.

The interlayer insulating film 13 has a 2-layer structure in which in which the non-doped silicate glass (NSG), i.e., the non-doped silicon oxide ($SiO_2$) film 11 and the BPSG film 12 are sequentially stacked. The NSG film 11 is in contact with the gate insulating film 8. The NSG film 11 has a function of suppressing movement of outward diffusion boron atoms and phosphorus atoms that are from the BPSG film 12, the outward diffusion boron atoms and phosphorus atoms being suppressed from moving toward the gate electrode 9.

The NSG film 11 is disposed to have the thickness t1 that from the surface of the gate electrode 9, is uniform spanning the front surface of the semiconductor substrate 10. The thickness t1 of the NSG film 11, for example, is about 200 nm and in terms of design, for example, is permissible to be in a range from about 50 nm to 400 nm. In other words, at the portion where the gate insulating film 8 and the BPSG film 12 oppose each other across the NSG film 11, the distance from the gate insulating film 8 to the BPSG film 12 may be 100 nm or less.

When the thickness t1 of the NSG film 11 is less 50 nm, the effects of providing the NSG film 11 are not obtained and therefore, is not desirable. When the thickness t1 of the NSG film 11 exceeds 400 nm, the NSG film 11 does not reflow by the reflow (flow) process, and a protrusion due to the gate electrode 9 on the front surface of the semiconductor substrate 10 causes the source electrode 15 to stand vertically from the front surface of the semiconductor substrate 10 due to the NSG film 11, and therefore, is not desirable.

The BPSG film 12 has a function of absorbing moisture such as water vapor contained in outside air. The thickness t2 of the BPSG film 12, for example, is about 600 n and in terms of design, for example, is permissible to be in a range from about 400 nm to 800 nm. A suitable boron concentration range for the BPSG film 12, for example, is about 4.5 mol % to 8.0 mol %. A suitable phosphorus concentration range for the BPSG film 12, for example, is about 1.0 mol % to 3.5 mol %.

Of the boron concentration and the phosphorus concentration of the BPSG film 12, at least the boron concentration is set to be within the suitable range described above, whereby the hygroscopicity of the BPSG film 12 may be enhanced. As a result, moisture in the BPSG film 12 may be suppressed from being released to the outside. The moisture in the BPSG film 12 is constituted the hydrogen (H) atoms and the water ($H_2O$) molecules in the BPSG film 12.

Further, enhancing the hygroscopicity of the BPSG film 12 maintains the moisture content of the BPSG film 12 at a certain amount. As a result, the movement of hydrogen atoms between the BPSG film 12 and the outside becomes possible and hydrogen atoms are supplied from the BPSG film 12 to a vicinity of the gate electrode 9. As a result, variation of the gate threshold voltage of a low current region of the MOSFET is suppressed.

The moisture amount of the moisture released from the BPSG film 12, for example, is more than $1 \times 10^{20}$ atoms/$cm^3$ but less than $1 \times 10^{22}$ atoms/$cm^3$. The moisture amount released from the BPSG film 12 is a total sum of the diffusion amount of (outward diffusion) hydrogen atoms diffused from the BPSG film 12 to the outside and the released amount of water molecules released from the BPSG film 12 to the outside.

Further, the boron concentration and the phosphorus concentration of the BPSG film 12 are respectively set to be within the suitable ranges described above, whereby the boron concentration and the phosphorus concentration of the BPSG film 12 are set within typical concentration ranges of at least 4.0 mol % and at least 1.2 mol %, respectively. As a result, the boron atoms and the phosphorus atoms in the BPSG film 12 may be suppressed from being dissolved in the moisture released from the BPSG film 12 and from disassociating from the BPSG film 12 and diffusing outside together with the moisture. Therefore, deterioration of members (e.g., the contact electrode 14, the source electrode 15, metal wiring, etc.) near the BPSG film 12 may be suppressed.

In the interlayer insulating film 13, the contact hole is provided that penetrates the interlayer insulating film 13 in the depth direction Z and reaches the front surface of the semiconductor substrate 10. The contact hole of the interlayer insulating film 13 exposes the $n^+$-type source region 5 and the $p^+$-type contact region 6. In the contact hole of the interlayer insulating film 13, the contact electrode 14 is provided on the front surface of the semiconductor substrate 10 and forms ohmic contacts with the $n^+$-type source region 5 and the $p^+$-type contact region 6.

The source electrode 15 is provided from a surface of the interlayer insulating film 13 so as to be embedded in the contact hole and span the front surface of the semiconductor substrate 10 in the contact hole. The source electrode 15 is electrically connected to the $n^+$-type source region 5 and the $p^+$-type contact region 6 via the contact electrode 14 and is insulated from the gate electrode 9 via the interlayer insulating film 13. For example, metal wiring (not depicted) such as a bonding wire or a copper block is soldered to the source electrode 15.

The contact electrode 16 that forms an ohmic contact with the $n^+$-type drain region (the $n^+$-type starting substrate 1) is provided on the rear surface of the semiconductor substrate 10 overall. The drain electrode 17 is provided on the surface of the contact electrode 16 and via the contact electrode 16, is electrically connected to the $n^+$-type starting substrate 1 that is the $n^+$-type drain region. The drain electrode 17, for example, is mounted to an insulated substrate (not depicted) such as a direct copper bonding (DCB) substrate by a solder joint.

Figure 3:
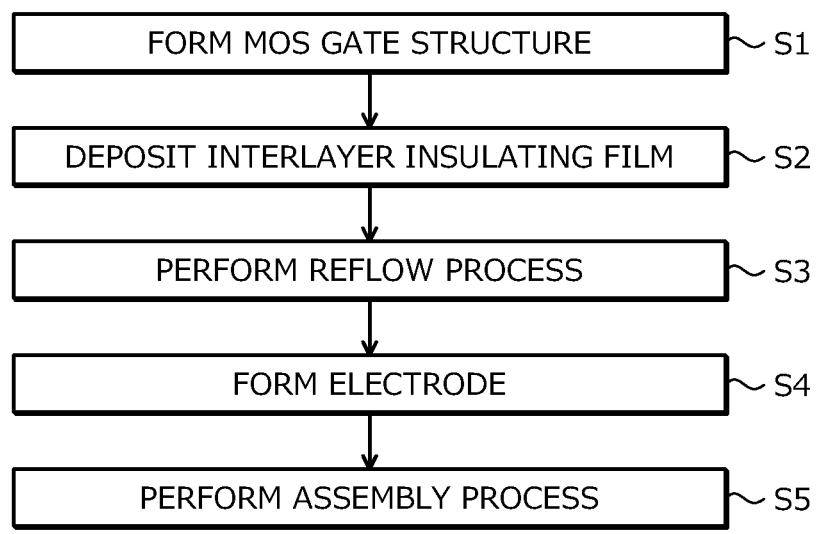
FIG. 3 is a flowchart of an outline of a method of manufacturing the silicon carbide semiconductor device according to the first embodiment.

A method of manufacturing the silicon carbide semiconductor device according to the first embodiment will be described. FIG. 3 is a flowchart of an outline of the method of manufacturing the silicon carbide semiconductor device according to the first embodiment. First, on the front surface of the $n^+$-type starting substrate (starting wafer) 1, the $n^-$-type semiconductor layer 10a constituting the $n^-$-type drift region 2 is formed by epitaxial growth. Next, by photolithography and ion implantation of a p-type impurity, the $p^+$-type base region 3 is selectively formed in a surface layer of the $n^-$-type semiconductor layer 10a. A portion of the $n^-$-type semiconductor layer 10a other than the $p^+$-type base region 3 constitutes the $n^-$-type drift region 2.

Next, the p-type semiconductor layer 10b that constitutes the p-type base region 4 is formed on the $n^-$-type semiconductor layer 10a by epitaxial growth so as to cover the $p^+$-type base region 3. By the processes up to here, the semiconductor substrate (semiconductor wafer) 10 in which the semiconductor layers 10a, 10b are sequentially stacked on the $n^+$-type starting substrate 1 is fabricated.

Next, a process including photolithography and ion implantation as one set is repeatedly performed under different conditions, whereby the $n^+$-type source region 5, the $p^+$-type contact region 6, and the n-type JFET region 7 are each selectively formed in the p-type semiconductor layer 10b. A portion of the p-type semiconductor layer 10b other than the $n^+$-type source region 5, the $p^+$-type contact region 6, and the n-type JFET region 7 constitutes the p-type base region 4.

Next, by a general method, the gate insulating film 8 and the gate electrode 9 are formed. By the processes up to here, the planar-gate MOS gate structure is formed (step S1). The gate insulating film 8, for example, may be a thermal oxide film (i.e., a silicon oxide film) that is formed by thermal oxidation or may be a deposited oxide film made from a general insulating material as the gate insulating film 8.

Next, for example, by an atmospheric pressure CVD method, the NSG film 11 and the BPSG film 12 are sequentially deposited as the interlayer insulating film 13 and respectively have the thicknesses t1, t2 in the ranges described above (step S2). Here, at step S2, the boron concentration and the phosphorus concentration of the BPSG film 12 is adjusted to be within the suitable ranges described above. Next, by heat treatment (reflow process), the BPSG film 12 is subject to reflow, whereby the surface of the interlayer insulating film 13 becomes flat (step S3). For the BPSG film 12, for example, a reflow process temperature of 1000 degrees C. or higher is advantageous while a reflow process temperature of 1100 degrees C. is more advantageous.

Next, the interlayer insulating film 13 is selectively removed, whereby a contact hole is formed and the $n^+$-type source region 5 and the $p^+$-type contact region 6 are exposed in the contact hole. Next, by a general method, the contact electrode 14 and the source electrode 15 are formed on the front surface of the semiconductor substrate 10, and the contact electrode 16 and the drain electrode 17 are formed on the rear surface (step S4). Next, the semiconductor wafer is diced (cut) into individual chips.

Next, a general assembly process for mounting the semiconductor chip in a package is performed (step S5). In particular, for example, a rear surface of the semiconductor chip (the semiconductor substrate 10) is soldered to an insulated substrate such as a DCB substrate. Thereafter, wire bonding, or soldering of a chip front surface to a copper block constituting an electrode terminal (wireless bonding) is performed with respect to the source electrode 15, whereby the MOSFET depicted in FIG. 1 is completed.

The method of manufacturing the silicon carbide semiconductor device according to the second embodiment includes at step S1 of the method of manufacturing the silicon carbide semiconductor device according to the first embodiment, forming the trench-gate MOS gate structure instead of the planar-gate MOS gate structure, whereby the MOSFET depicted in FIG. 2 is completed.

As described above, according to the first and second embodiments, the interlayer insulating film that covers the gate electrode has the 2-layer structure in which the NSG film and the BPSG film are sequentially stacked. As a result, during the reflow process for making the surface of the BPSG film flat, even in an instance of outward diffusion of the boron atoms and the phosphorus atoms from BPSG film, the boron atoms and the phosphorus atoms may be suppressed from moving toward the gate electrode by the NSG film that underlies the BPSG film.

Further, according to the first and the second embodiments, the boron concentration and the phosphorus concentration of the BPSG film are set to be within the suitable ranges described above, whereby the boron concentration and the phosphorus concentration of the BPSG film are respectively set to be within typical concentration ranges. As a result, outward diffusion of the boron atoms and the phosphorus atoms from the BPSG film as a consequence of the reflow process may be suppressed. Further, the reflow process temperature for the BPSG film is increased, whereby the outward diffusion of the boron atoms and the phosphorus atoms from the BPSG film may be further suppressed.

Figure 9:
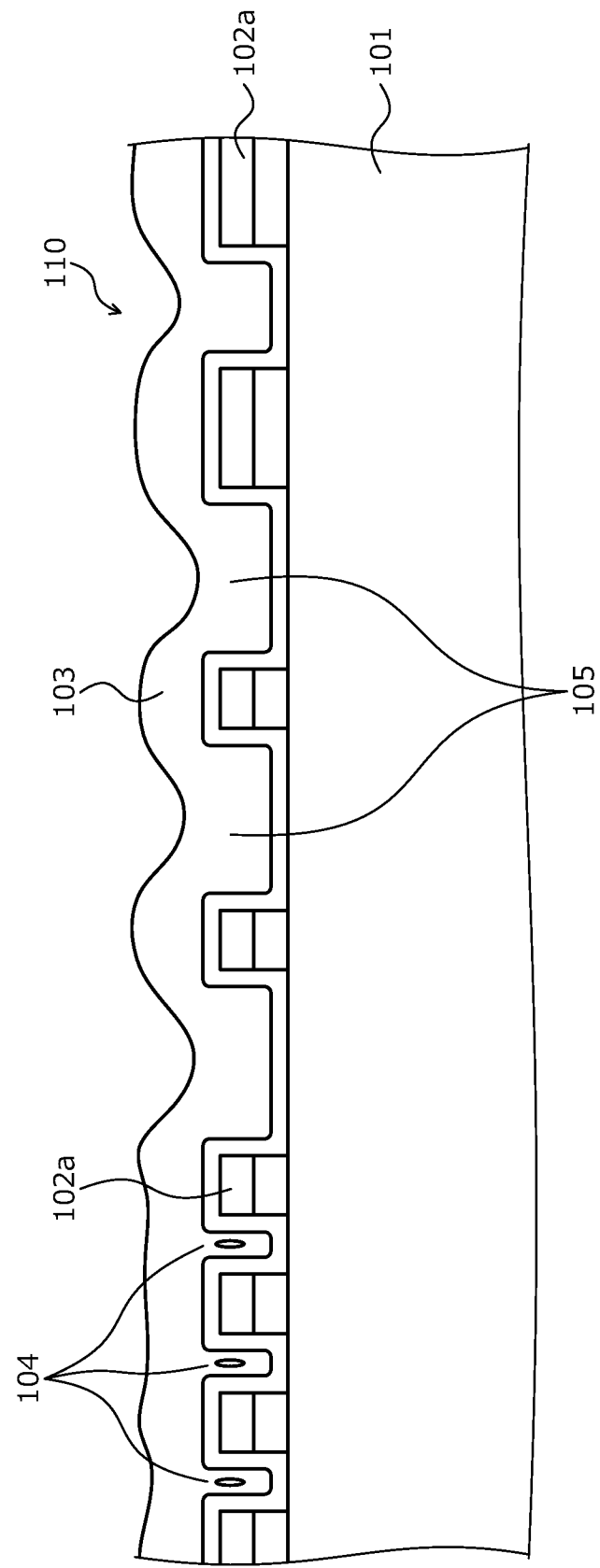
FIG. 9 is a cross-sectional view of a structure of a conventional semiconductor device during manufacture.
Figure 10:
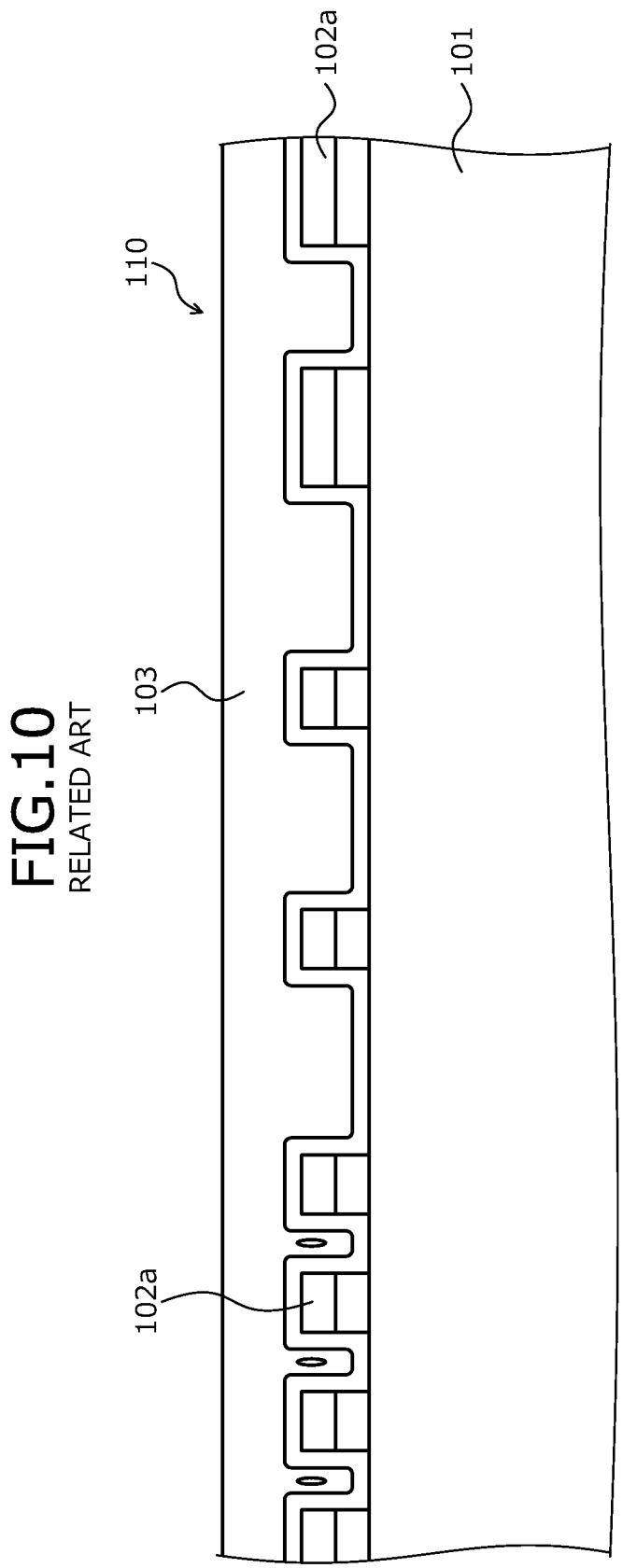
FIG. 10 is a cross-sectional view of a structure of a conventional semiconductor device during manufacture.

Further, according to the first and the second embodiments, at least the boron concentration of the BPSG film is set higher than that in the conventional method (refer to FIGS. 9 and 10), whereby the hygroscopicity of the BPSG film is enhanced, enabling the moisture content of the BPSG film to be maintained at a certain amount. As a result, hydrogen atoms from the BPSG film are supplied to a vicinity of the gate electrode, enabling variation of the gate threshold voltage of a low current region of the MOSFET to be suppressed.

A structure of the silicon carbide semiconductor device according to a third embodiment will be described. The silicon carbide semiconductor device according to the third embodiment differs from the silicon carbide semiconductor device according to the first and the second embodiments in that aluminum (Al) is added to the BPSG film 12.

An aluminum concentration of the BPSG film 12, for example, is in a range of about 0.1 times to 1 times a total sum of the boron concentration and the phosphorus concentration of the BPSG film 12. One times the total sum of the boron concentration and the phosphorus concentration of the BPSG film 12, for example, is about 10 mol %. Aluminum atoms added to the BPSG film 12 have a function of neutralizing the charge of the boron atoms and the phosphorus atoms in the BPSG film 12, thereby preventing ionization of the boron atoms and the phosphorus atoms in the BPSG film 12.

Suitable ranges of the boron concentration and the phosphorus concentration of the BPSG film 12 are similar to those of the first and the second embodiments. When the boron concentration and the phosphorus concentration of the BPSG film 12 exceed upper limits of the suitable ranges described above, the charge of the boron atoms and the phosphorus atoms cannot be completely neutralized even with the addition of aluminum to the BPSG film 12, whereby boron atoms and phosphorus atoms that ionize are present and disassociation of the boron atoms and the phosphorus atoms from the BPSG film 12 cannot be prevented.

The method of manufacturing the silicon carbide semiconductor device according to the third embodiment includes at step S2 of the method of manufacturing the silicon carbide semiconductor device according to the first embodiment, adding aluminum to the BPSG film 12 when the BPSG film 12 is deposited by the atmospheric pressure CVD method. Here, as an aluminum source supplied to the furnace, for example, an aluminum chloride ($AlCl_3$) gas or a trimethylaluminium (TMA) (($CH_3)_3Al$) gas may be used.

As described, according to the third embodiment, effects similar to those of the first embodiment may be obtained. Further, according to the third embodiment, aluminum is added to the BPSG film, whereby ionization of the boron atoms and the phosphorus atoms in the BPSG film may be prevented, thereby enabling disassociation of the boron atoms and the phosphorus atoms from the BPSG film to be prevented.

Figure 4:
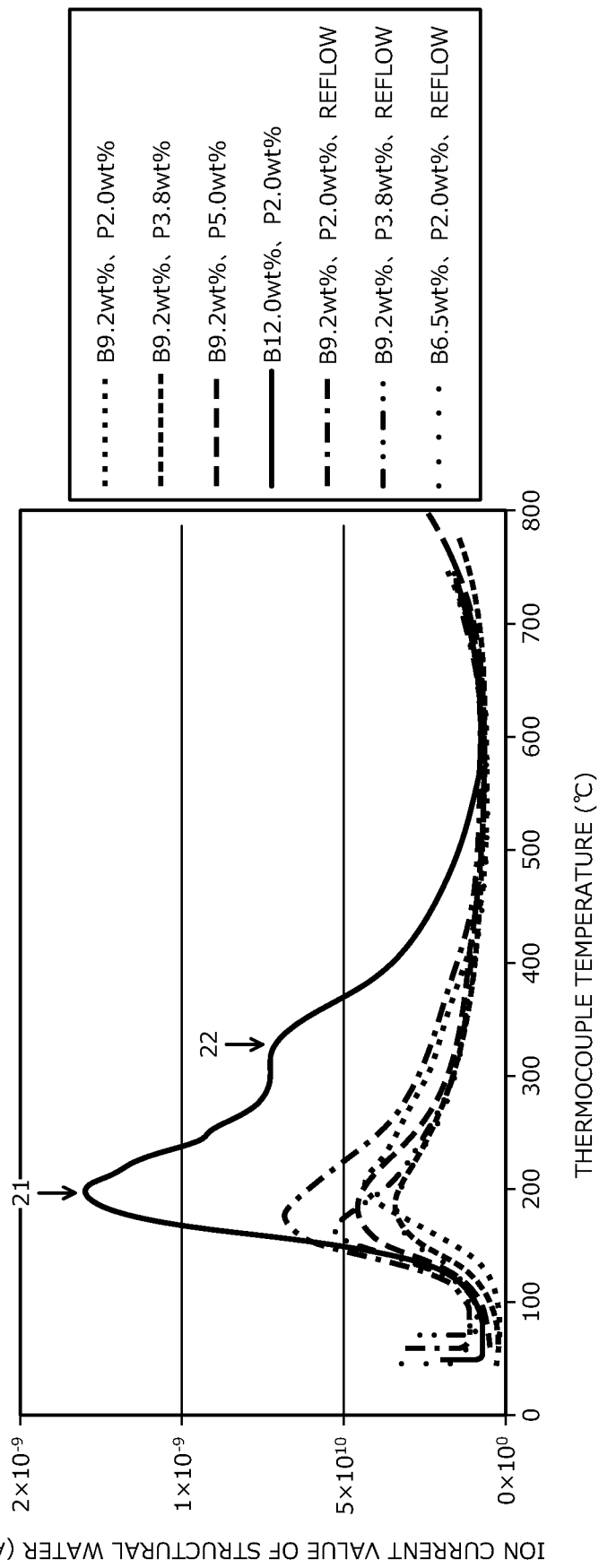
FIG. 4 is a characteristics diagram depicting adsorption and desorption of structural water in a BPSG film.

The moisture content of the BPSG film 12 was verified. FIG. 4 is a characteristics diagram depicting adsorption and desorption of structural water in the BPSG film. In FIG. 4, a horizontal axis indicates heating temperature (thermocouple temperature) of samples by thermocouple of thermal desorption spectroscopy (TDS) equipment while a vertical axis indicates ion current value of structural water. Here, structural water corresponds to, for example, the moisture contained in the BPSG film 12 as hydroxide ions ($OH^-$) and in particular, is charged particles having a mass-to-charge ratio of M/z=18.

First, seven samples having the structure of the silicon carbide semiconductor device according to the second embodiment were fabricated (hereinafter, first example). The samples of the first example had respectively differing boron concentrations and phosphorus concentrations of the BPSG film 12. In particular, the samples of the first example had boron concentrations of 6.5 wt %, 9.2 wt % and 12.0 wt %, and phosphorus concentrations of 2.0 wt %, 3.8 wt % and 5.0 wt % (refer to annotation in FIG. 4).

For example, in the annotation in FIG. 4, "B: 9.2 wt %, P: 2.0 wt %" indicates a sample having a boron concentration of 9.2 wt % and a phosphorus concentration of 2.0 wt %. Samples for which "reflow" is indicated at the end are samples for which the reflow process for the BPSG film 12 was performed.

Results of measurement of adsorption and desorption of structural water at the surface of the BPSG film 12 by TDS for the seven samples of the first example are depicted in FIG. 4.

From the results depicted in FIG. 4, for all of the samples of the first example, adsorption 21 of the structural water (moisture) at the surface of the BPSG film 12 was confirmed when the heating temperature was near 200 degrees C. and desorption 21 of the structural water from the BPSG film 12 was confirmed when the heating temperature was near 300 degrees C. to 400 degrees C. On the vertical axis in FIG. 4, the higher is the ion current value of the structural water, the larger is the adsorption 21 and the desorption 21 of the structural water. From these results, it is surmised that the moisture content of the BPSG film 12 is maintained by a supplementation of moisture such as the water vapor contained in outside air.

Figure 5:
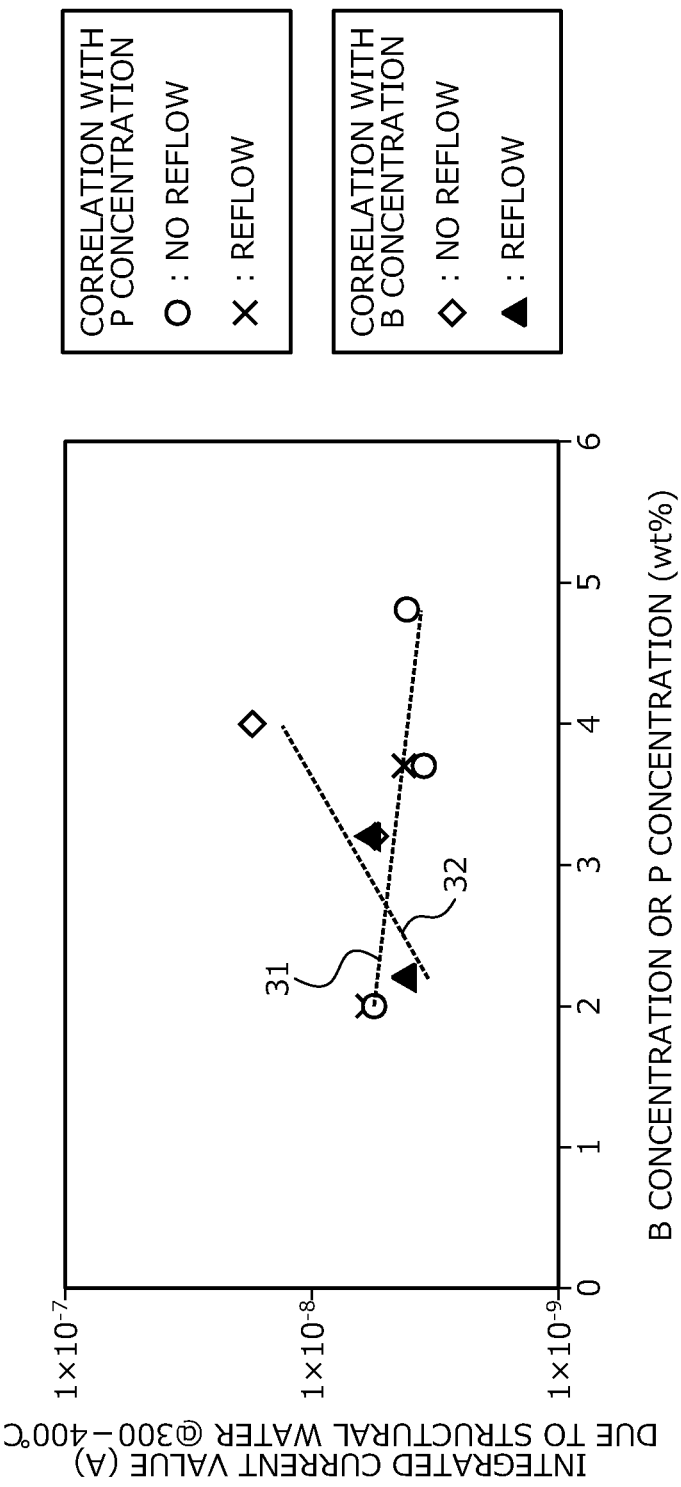
FIG. 5 is a characteristics diagram depicting a relationship of boron concentration or phosphorus concentration of the BPSG film and the released amount of structural water contained in the BPSG film.

The released amount of moisture contained in the BPSG film 12 was verified. FIG. 5 is a characteristics diagram depicting a relationship of the boron concentration or the phosphorus concentration of the BPSG film and the released amount of structural water contained in the BPSG film. In FIG. 5, a horizontal axis indicates the boron concentration (B concentration) [wt %] or the phosphorus concentration (P concentration) [wt %] while a vertical axis indicates an integrated current value [A] due to the structural water. First, a sample having the structure of the silicon carbide semiconductor device according to the first embodiment was fabricated (hereinafter, second example).

In particular, as samples of the second example, multiple samples were fabricated in which the boron concentration of the BPSG film 12 was 9.2 wt % and the phosphorus concentration of the BPSG film 12 differed and for which reflow was performed "reflow" or not performed "no reflow" (in FIG. 5, "×" and "○", respectively). Additionally, as samples of the second example, multiple samples were fabricated in which the phosphorus concentration of the BPSG film 12 was 2 wt % and the boron concentration of the BPSG film 12 differed and for which reflow was performed "reflow" or not performed "no reflow" (in FIG. 5, "▲" and "◇", respectively).

For the samples of the second example, results of measurement of the amount of structural water released at a heating temperature near 300 degrees C. to 400 degrees C. at which the desorption 21 (refer to FIG. 4) of the structural water occurs are depicted in FIG. 5. A method of calculating the moisture content of the BPSG film 12 from the integrated current value due to the structural water is as follows.

When the surface area of the samples of the second example is 1 cm$^2$ and the integrated current value due to the structural water is $2\times10^{-8}$ A, the moisture content of the BPSG film 12 is $3.5\times10^{16}$ atoms/cm$^2$. Since the thickness t2 of the BPSG film 12 is set to be 600 nm, when converted in terms of per unit volume, the moisture content of the BPSG film 12 is $5.6\times10^{20}$ atoms/cm$^3$.

When the surface area of the samples of the second example is 1 cm$^2$ and the integrated current value due to the structural water is $2\times10^{×8}$ A, the moisture content of the BPSG film 12 is $3.5\times10^{17}$ atoms/cm$^2$. Since the thickness t2 of the BPSG film 12 is set to be 600 nm, when converted in terms of per unit volume, the moisture content of the BPSG film 12 is $5.6\times10^{21}$ atoms/cm$^3$.

From the results depicted in FIG. 5, for the samples in which the boron concentration of the BPSG film 12 was equal (approximation line 31 of measurement points "○" and "×": correlation with P concentration), it was confirmed that the integrated current value due to the structural water was substantially constant and independent of the phosphorus concentration. In other words, it was confirmed that the moisture amount released from the BPSG film 12 is not dependent on the phosphorus concentration of the BPSG film 12.

Further, for the samples in which the phosphorus concentration of the BPSG film 12 was equal (approximation line 32 of measurement points "◇" and "▲": correlation with B concentration), it was confirmed that the integrated current value due to structural water increased according to increases in the boron concentration. In other words, the amount of moisture released from the BPSG film 12 was confirmed to be independent of reflow and to increase according to increases in the boron concentration of the BPSG film 12.

Figure 6:
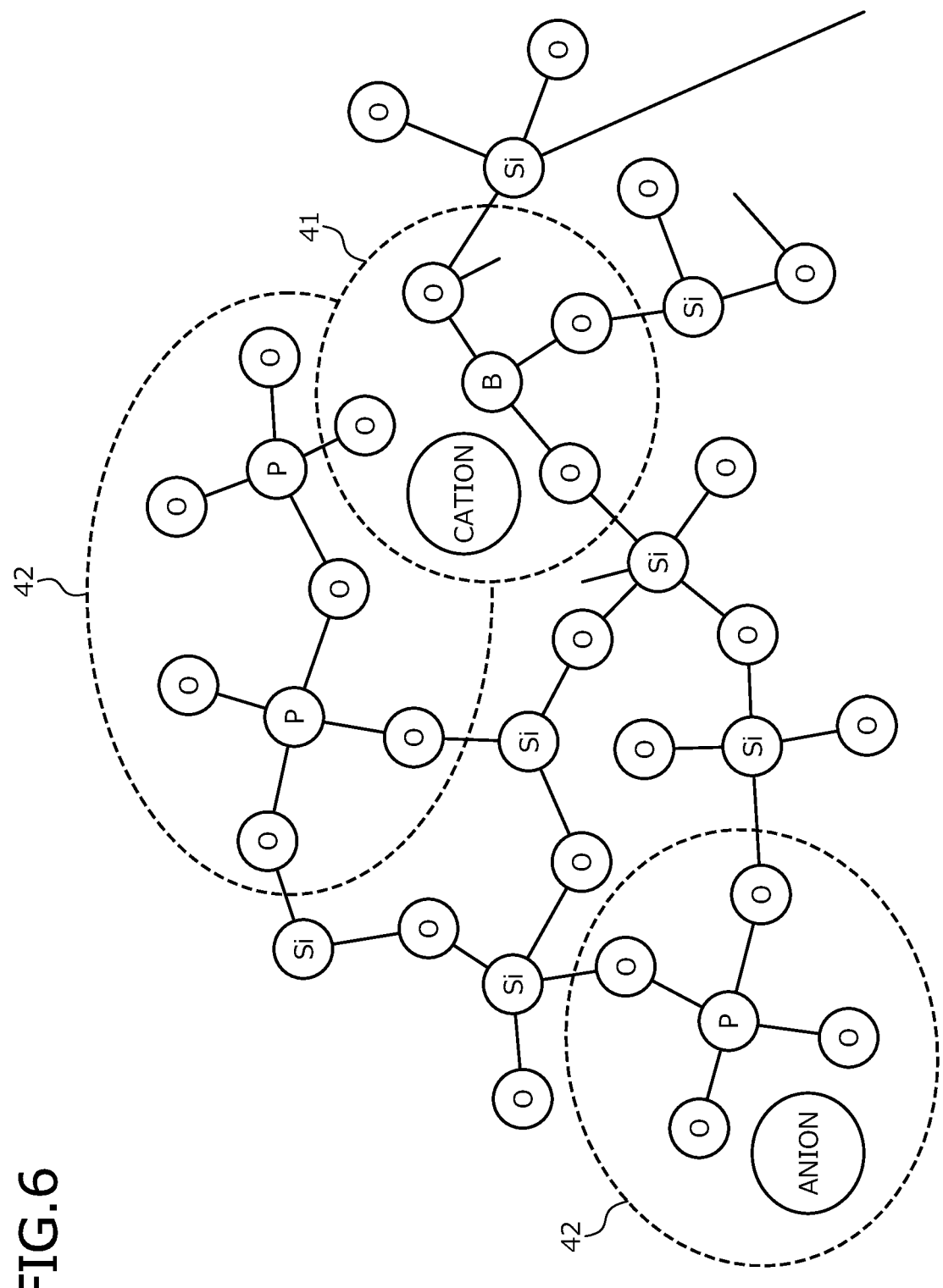
FIG. 6 is a diagram schematically depicting an atomic structure of the BPSG film.

An atomic structure of the BPSG film 12 will be described. FIG. 6 is a diagram schematically depicting an atomic structure of the BPSG film. As depicted in FIG. 6, the boron (B) atoms and the phosphorus (P) atoms together with silicon (Si) atoms have a same tetracoordinate polyhedral geometric structure. Therefore, in the BPSG film 12, similarly to the Si atoms, the boron atoms and the phosphorus atoms each bonds with four oxygen (O) atoms and together with the silicon atoms, constitute a network structure of silica glass ($SiO_2$).

In the BPSG film 12, a site 41 containing at least one atomic structure constituted by one boron atom and four oxygen atoms bonded to the one boron atom captures and electrically neutralizes cations. Additionally, a site 42 containing at least one atomic structure constituted by one phosphorus atom and four oxygen atoms bonded to the one phosphorus atom captures and electrically neutralizes anions.

Further, the aluminum (Al) atoms have a tetracoordinate, pentacoordiante, or hexcoordinate polyhedral geometric structure. Therefore, while not depicted, the aluminum atoms added to the BPSG film 12 constitute the network structure of the silica glass ($SiO_2$) together with the silicon atoms, the boron atoms, and the phosphorus atoms, and have a function stabilizing the boron atoms and the phosphorus atoms.

Figure 8:
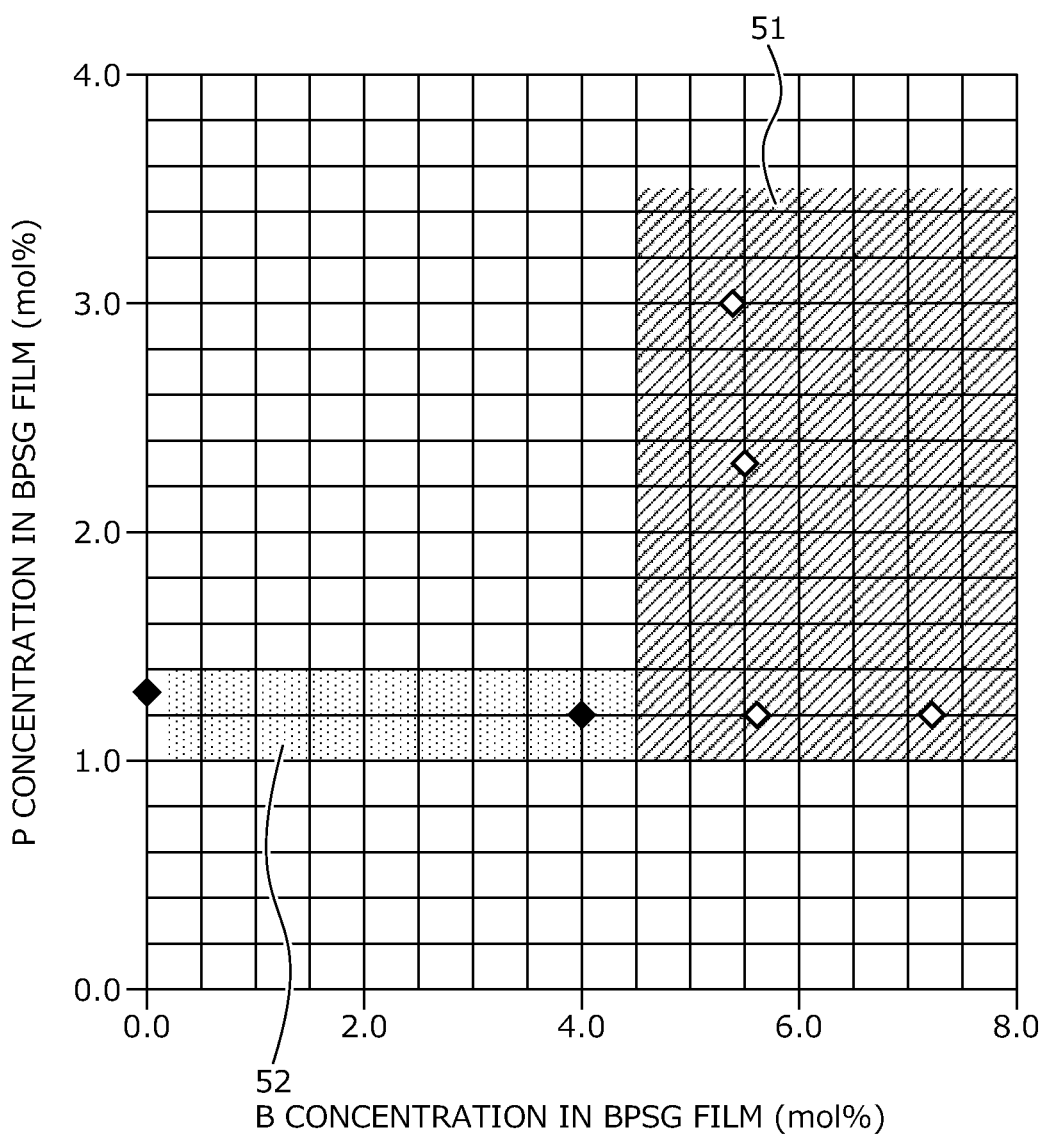
FIG. 8 is a characteristics diagram depicting suitable ranges of the boron concentration and the phosphorus concentration of the BPSG film.

Suitable ranges of the boron concentration and the phosphorus concentration of the BPSG film 12 were verified. FIG. 7 is a table depicting relationships of the boron concentration and the phosphorus concentration of the BPSG film with gate threshold voltage variation. FIG. 8 is a characteristics diagram depicting suitable ranges of the boron concentration and the phosphorus concentration of the BPSG film. First, multiple samples having the structure of the silicon carbide semiconductor device according to the second embodiment were fabricated (hereinafter, third example).

In the samples of the third example, the boron concentration and the phosphorus concentration of the BPSG film 12 respectively differed. For the samples of the third example, results of measurement of the moisture amount (total sum of released amount H and $H_2O$) released from the BPSG film 12 and whether variation of the gate threshold voltage was suppressed are depicted in FIG. 7. In FIG. 7, in a column "suppression of gate threshold voltage variation", "○" indicates a result of variation of the gate threshold voltage being suppressed while "×" indicates a result of variation of the gate threshold voltage not being suppressed.

From the results depicted in FIG. 7, for the samples in which the boron concentration and the phosphorus concentration of the BPSG film 12 were set to be within the suitable ranges described above, it was confirmed that variation of the gate threshold voltage could be suppressed. While not depicted, for samples in which the boron concentration of the BPSG film 12 was the lower limit or the upper limit of the suitable range described above and the phosphorus concentration of the BPSG film 12 was the lower limit or the upper limit of the suitable range described above, it was confirmed that variation of the gate threshold voltage could be suppressed.

Further, FIG. 7 depicts in a column "THB test", results of a temperature humidity bias (THB) test performed with respect to multiple samples for which the boron concentration, the phosphorus concentration, the aluminum concentration and the reflow process temperature of the BPSG film 12 differed respectively. The THB test was performed under conditions in which the temperature was set to 120 degrees C. and the humidity (moisture amount in ambient air) was 85%, while a voltage of 960V that was positive with respect to the source electrode 15 was applied to the drain electrode 17 for 1000 hours.

In the column "THB test" of FIG. 7, "○" indicates that no defect occurred while "×" indicates that a defect occurred and "−" indicates that the THB test was not performed. A defect under the THB test is an insulation defect of the interlayer insulating film 13, corrosion of an electrode layer (e.g., the contact electrode 14, the source electrode 15, metal wiring), etc. that occurs due to temperature, humidity, and electric potential differences. Conditions of the samples of the third example for which the THB test was performed were as follows.

A first condition of the samples of the third example for which the THB test was performed was a case in which six samples each having the BPSG film 12 of the same boron concentration and phosphorus concentration as those of the six samples verified for the effect of suppressing variation of the gate threshold voltage described above were fired at a reflow process temperature of 950 degrees C. (column "950° C. firing" in FIG. 7). Aluminum was not added to the BPSG film 12 of the samples of the first condition for the THB test performed.

A second condition of the samples of the third example for which the THB test was performed was a case in which six samples each having the BPSG film 12 of the same boron concentration and phosphorus concentration as those of the six samples verified for the effect of suppressing variation of the gate threshold voltage described above were fired at a reflow process temperature of 1050 degrees C. (column "1050° C. firing" in FIG. 7). Aluminum was not added to the BPSG film 12 of the samples of the second condition for the THB test performed.

A third condition of the samples of the third example for which the THB test was performed was a case in which of the six samples, four samples each having the BPSG film 12 of the same boron concentration and phosphorus concentration as the samples for which the gate threshold voltage did not vary (four samples on lower side of table in FIG. 7) and to which aluminum was added at a rate of 0.1 times the total sum of the boron concentration and the phosphorus concentration were fired at a reflow process temperature of 950 degrees C. (column "950° C. firing, Al addition of 0.1 times" in FIG. 7).

A fourth condition of the samples of the third example for which the THB test was performed was a case in which of the six samples, four samples each having the BPSG film 12 of the same the boron concentration and phosphorus concentration gate as samples for which the threshold voltage did not vary (four samples on lower side of table in FIG. 7) and to which aluminum was added at a rate of 1 times the total sum of the boron concentration and the phosphorus concentration were fired at a reflow process temperature of 950 degrees C. (column "950° C. firing, Al addition of 1 times" in FIG. 7).

From the results of the THB test depicted in FIG. 7, in the case of the reflow process temperature of 950 degrees C. for the BPSG film 12, it was confirmed that when the boron concentration or the phosphorus concentration of the BPSG film 12, or both concentrations are high, defects occur in the THB test. However, this problem may be solved by increasing the reflow process temperature for the BPSG film 12 and/or adding to the BPSG film 12, aluminum at a predetermined concentration with respect to the total sum of the boron concentration and the phosphorus concentration.

For example, to suppress the occurrence of defects in the THB test, the reflow process temperature for the BPSG film 12 may be set to be in a range from 1000 degrees C. to 1150 degrees C., in particular, 1050 degrees C. as depicted in FIG. 7. Further, even when the reflow process temperature for the BPSG film 12 is lowered to about 950 degrees C., aluminum may be added to the BPSG film 12 at a rate in a range of 0.1 times to 1 times the total sum of the boron concentration and the phosphorus concentration.

While not depicted, when the boron concentration of the BPSG film 12 exceeds the upper limit of the suitable range described above or when the phosphorus concentration of the BPSG film 12 exceeds the upper limit of the suitable range described above, in the THB test, phosphoric acid ($H_3PO_4$) disassociates from the BPSG film 12 and electrodes (e.g., the source electrode 15) that are made from aluminum corrode. However, it was confirmed that this problem did not occur in the samples in which aluminum was added to the BPSG film 12.

In FIG. 8, a suitable range 51 of the boron concentration and the phosphorus concentration described above of the BPSG film 12 of the present invention is depicted by heavy hatching. As depicted in FIG. 8, the suitable range 51 of the boron concentration and the phosphorus concentration of the BPSG film 12 of the present invention includes the phosphorus concentration range applied by the present inventor to the BPSG film of an existing product and is higher than the boron concentration range applied by the present inventor to the BPSG film of the existing product.

In FIG. 8, a range 52 of the boron concentration and the phosphorus concentration applied by the present inventor to the BPSG film of the existing product is a region indicated by light hatching and in particular, the boron concentration is less than about 4.5 mol % while the phosphorus concentration is in a range from about 1.0 mol % to 1.4 mol %. In particular, the BPSG film of the existing product, for example, contains 6.5 mol % of boron oxide ($B_2O_3$) and 2.0 mol % of phosphorus oxide ($P_2O_5$).

In the aforementioned, the present invention is not limited to the embodiments described above and may be variously modified within a range not departing from the spirit of the present invention.

The silicon carbide semiconductor device and the method of manufacturing a silicon carbide semiconductor device according to the present invention achieve an effect in that the hygroscopicity of the BPSG film is enhanced, thereby enabling suppression of variation of the gate threshold voltage. Additionally, outward diffusion of impurity atoms from the interlayer insulating film may be suppressed, thereby enabling an occurrence of defects to be suppressed.

As described above, the silicon carbide semiconductor device and the method of manufacturing a silicon carbide semiconductor device according to the present invention is useful for a semiconductor device that has an interlayer insulating film that covers, for example, element structures that cause unevenness like MOS gate structures at a main surface of a semiconductor substrate.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
an element structure provided on a front surface side of a semiconductor substrate and having a predetermined semiconductor region provided in the semiconductor substrate and a protrusion protruding from a front surface of the semiconductor substrate;
an interlayer insulating film having a 2-layer structure including a first insulating film that covers the element structure and a second insulating film that covers the first insulating film;
a contact hole penetrating the interlayer insulating film in a depth direction and reaching the semiconductor substrate; and
an electrode provided on a surface of the interlayer insulating film and electrically connected to the semiconductor region via the contact hole,
wherein
the electrode is disposed such that the electrode is in contact with opposite sides of the second insulating film,
the first insulating film is a non-doped silicon oxide film,
a moisture amount of the second insulating film is more than $1\times10^{20}$ atoms/cm$^3$ and less than $1\times10^{22}$ atoms/cm$^3$,
the second insulating film is an oxide film containing boron and phosphorus, and
the second insulating film has a boron concentration in a range from 4.5 mol % to 8.0 mol %.

2. The silicon carbide semiconductor device according to claim 1, wherein
the second insulating film has a phosphorus concentration in a range from 1.0 mol % to 3.5 mol %.

3. The silicon carbide semiconductor device according to claim 1, wherein
the first insulating film has a thickness in a range from 50 nm to 400 nm.

4. The silicon carbide semiconductor device according to claim 1, wherein
the second insulating film has a thickness in a range from 400 nm to 800 nm.

5. The silicon carbide semiconductor device according to claim 1, wherein
the element structure is an insulated gate structure constituted by a metal, an oxide film, and a semiconductor, the insulated gate structure having a gate electrode provided on the front surface of the semiconductor substrate via a gate insulating film,
the protrusion is the gate insulating film and the gate electrode,
the first insulating film covers the gate electrode, and
a distance from the gate insulating film to the second insulating film is at most 100 nm at a portion where the gate insulating film and the second insulating film oppose each other across the first insulating film.

6. A method of manufacturing a silicon carbide semiconductor device having on a front surface side of a semiconductor substrate, an element structure that has a predetermined semiconductor region provided in the semiconductor substrate and a protrusion protruding from a front surface of the semiconductor substrate, the method comprising:
forming in the semiconductor substrate, the predetermined semiconductor region constituting the element structure;
forming on a front surface of the semiconductor substrate, the protrusion constituting the element structure;
stacking sequentially on the front surface of the semiconductor substrate, a first insulating film covering the element structure and a second insulating film covering the first insulating film, to form an interlayer insulating film having a 2-layer structure constituted by the first insulating film and the second insulating film;
performing heat treatment and planarizing a surface of the interlayer insulating film;
partially removing the interlayer insulating film including the first insulating film and the second insulating film, after planarizing the surface of the interlayer insulating film, and forming a contact hole that penetrates the interlayer insulating film in a depth direction and reaches the semiconductor substrate; and
forming an electrode on the surface of the interlayer insulating film, embedding the electrode in the contact hole, and electrically connecting the semiconductor region and the electrode, wherein
forming the interlayer insulating film includes:
forming a non-doped silicon oxide film as the first insulating film, and
forming an oxide film containing boron and phosphorus, as the second insulating film,
a moisture amount of the second insulating film is more than $1\times10^{20}$ atoms/cm$^3$ and less than $1\times10^{22}$ atoms/cm$^3$, and
the second insulating film has a boron concentration in a range from 4.5 mol % to 8.0 mol %.

7. The method according to claim 6, wherein
performing heat treatment and planarizing the surface of the interlayer insulating film is performed at at least 1000 degrees C.

8. The method according to claim 6, wherein the oxide film further contains aluminum in a concentration in a range from about 0.1 times to 1 times a total sum of the boron concentration and a phosphorus concentration of the second insulating film.

9. The method according to claim 6, wherein
the second insulating film has a phosphorus concentration in a range from 1.0 mol % to 3.5 mol %.

10. The method according to claim 9, wherein the oxide film further contains aluminum in a concentration in a range from about 0.1 times to 1 times a total sum of the boron concentration and the phosphorus concentration of the second insulating film.

11. The method according to claim 6, wherein
the first insulating film has a thickness in a range from 50 nm to 400 nm.

12. The method according to claim 6, wherein
the second insulating film has a thickness in a range from 400 nm to 800 nm.

13. The silicon carbide semiconductor device according to claim 1, wherein
the second insulating film contains aluminum in a concentration range from about 0.1 times to 1 times a total sum of the boron concentration and a phosphorus concentration of the second insulating film.

14. The silicon carbide semiconductor device according to claim 2, wherein
the second insulating film contains aluminum in a concentration range from about 0.1 times to 1 times a total sum of the boron concentration and the phosphorus concentration of the second insulating film.

15. The silicon carbide semiconductor device according to claim 5, wherein a lower bottom surface of the first insulating film is in contact with a source region of the element structure and an inner side surface of the first insulating film is in contact with a side surface of the gate insulating film.

16. A silicon carbide semiconductor device, comprising:
- an element structure provided on a front surface side of a semiconductor substrate and having a predetermined semiconductor region provided in the semiconductor substrate and a protrusion protruding from a front surface of the semiconductor substrate;
- an interlayer insulating film having a 2-layer structure including a first insulating film that covers the element structure and a second insulating film that covers the first insulating film;
- a contact hole penetrating the interlayer insulating film in a depth direction and reaching the semiconductor substrate; and
- an electrode provided on a surface of the interlayer insulating film and electrically connected to the semiconductor region via the contact hole, wherein
the first insulating film is a non-doped silicon oxide film,
a moisture amount of the second insulating film is more than $1\times10^{20}$ atoms/cm$^3$ and less than $1\times10^{22}$ atoms/cm$^3$,
the second insulating film is an oxide film containing boron, aluminum, and phosphorus, and
the second insulating film has a boron concentration in a range from 4.5 mol % to 8.0 mol % and an aluminum concentration in a range from about 0.1 times to 1 times a total sum of the boron concentration and a phosphorus concentration of the second insulating film.

17. The silicon carbide semiconductor device according to claim 16, wherein
the electrode is disposed such that the electrode is in contact with opposite sides of the second insulating film.

18. The silicon carbide semiconductor device according to claim 16, wherein
the phosphorus concentration of the second insulating film is in a range from 1.0 mol % to 3.5 mol %.

* * * * *